US009378991B2

(12) United States Patent
Takahashi et al.

(10) Patent No.: US 9,378,991 B2
(45) Date of Patent: Jun. 28, 2016

(54) SUBSTRATE PROCESSING APPARATUS AND SUBSTRATE PROCESSING METHOD

(75) Inventors: Akira Takahashi, Toyama (JP); Hidehiro Yanai, Toyama (JP); Masakazu Sakata, Toyama (JP)

(73) Assignee: HITACHI KOKUSAI ELECTRIC INC., Tokyo (JP)

(*) Notice: Subject to any disclaimer, the term of this patent is extended or adjusted under 35 U.S.C. 154(b) by 789 days.

(21) Appl. No.: 12/585,341

(22) Filed: Sep. 11, 2009

(65) Prior Publication Data

US 2010/0068414 A1 Mar. 18, 2010

(30) Foreign Application Priority Data

Sep. 12, 2008 (JP) .................................. 2008-234597
Aug. 3, 2009 (JP) .................................. 2009-180426
Sep. 8, 2009 (JP) .................................. 2009-206664

(51) Int. Cl.
| | | |
|---|---|---|
| *C23C 16/513* | (2006.01) | |
| *C23C 16/00* | (2006.01) | |
| *C23C 16/46* | (2006.01) | |
| *H01L 21/67* | (2006.01) | |
| *H01L 21/677* | (2006.01) | |

(52) U.S. Cl.
CPC ...... *H01L 21/6719* (2013.01); *H01L 21/67703* (2013.01)

(58) Field of Classification Search
CPC .... C23C 16/54; C23C 16/4412; C23C 16/568
See application file for complete search history.

(56) References Cited

U.S. PATENT DOCUMENTS

| | | | |
|---|---|---|---|
| 2002/0096114 A1* | 7/2002 | Carducci et al. ............... | 118/715 |
| 2003/0173031 A1* | 9/2003 | Aggarwal ........... | C23C 16/4584 156/345.51 |
| 2006/0156979 A1* | 7/2006 | Thakur et al. ................. | 118/715 |
| 2007/0051312 A1* | 3/2007 | Sneh .............................. | 118/719 |
| 2007/0175864 A1* | 8/2007 | Niewmierzycki et al. ...... | 216/90 |
| 2009/0143911 A1* | 6/2009 | Gage et al. .................... | 700/248 |

FOREIGN PATENT DOCUMENTS

| | | |
|---|---|---|
| JP | A-11-111820 | 4/1999 |
| JP | A-2006-86180 | 3/2006 |
| JP | A-2008-513980 | 5/2008 |
| KR | 10-2007-0098308 | 10/2007 |
| WO | WO 2006/031956 A2 | 3/2006 |
| WO | WO 2007/126289 A1 | 11/2007 |

OTHER PUBLICATIONS

Korean Office Action dated Mar. 13, 2012 for Korean Patent Application No. 10-2009-0085793 (with translation).
Chinese Office Action dated Aug. 30, 2010 in Chinese Patent Application No. 2009-10173141.2 (with translation).
Notification of Submission of Written Opinion issued in Korean Application No. 10-2009-0085793 dated Jun. 17, 2011 (with translation).
Notification of Reasons for Refusal dated Sep. 2, 2013 from Japanese Patent Application No. 2009-206664 (with English-language translation).

\* cited by examiner

*Primary Examiner* — Parviz Hassanzadeh
*Assistant Examiner* — Nathan K Ford
(74) *Attorney, Agent, or Firm* — Oliff PLC

(57) ABSTRACT

A substrate processing apparatus includes a transport chamber and a processing chamber that processes substrates. The transport chamber has a first substrate transport member transporting the substrates from the transport chamber to the processing chamber. The processing chamber has a first processing unit which is adjacent to the transport chamber and has a first substrate placing base, a second processing unit which is adjacent to the other side of the transport chamber in the first processing unit and has a second substrate placing base, a second substrate transport member transporting the substrates between the first processing unit and the second processing unit, and a control unit controlling at least the second substrate transport member.

10 Claims, 14 Drawing Sheets

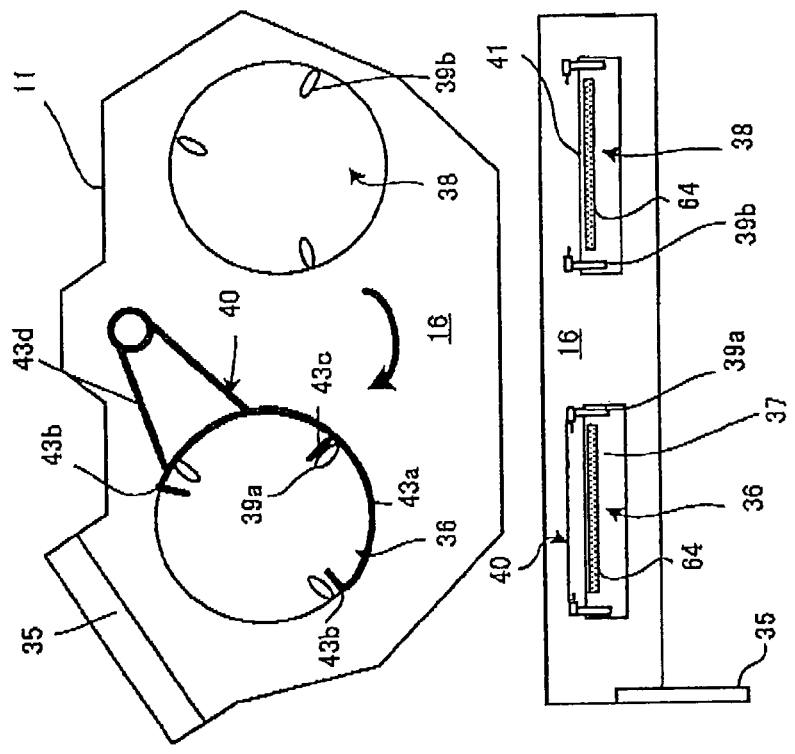
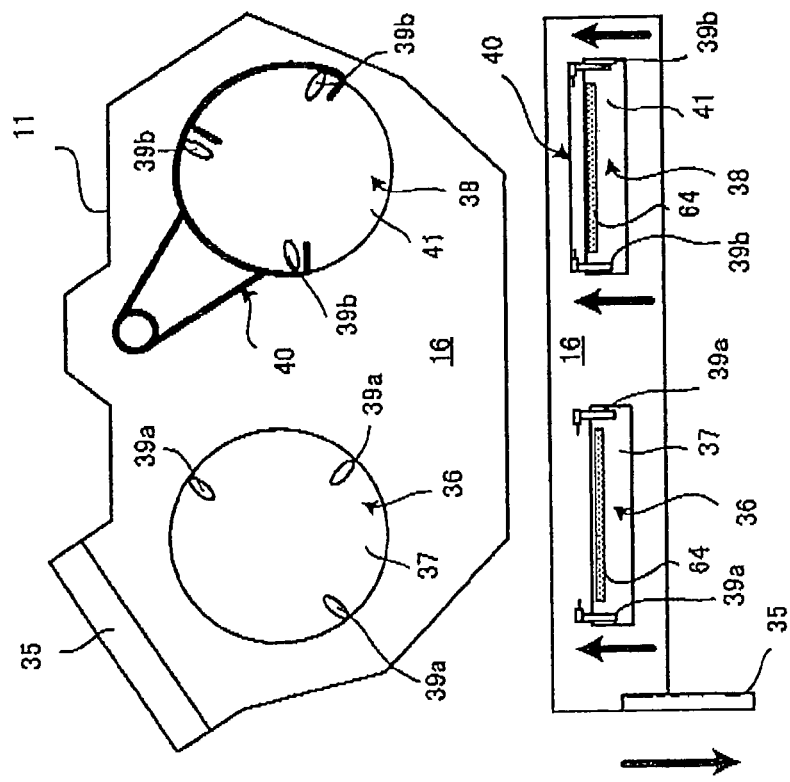

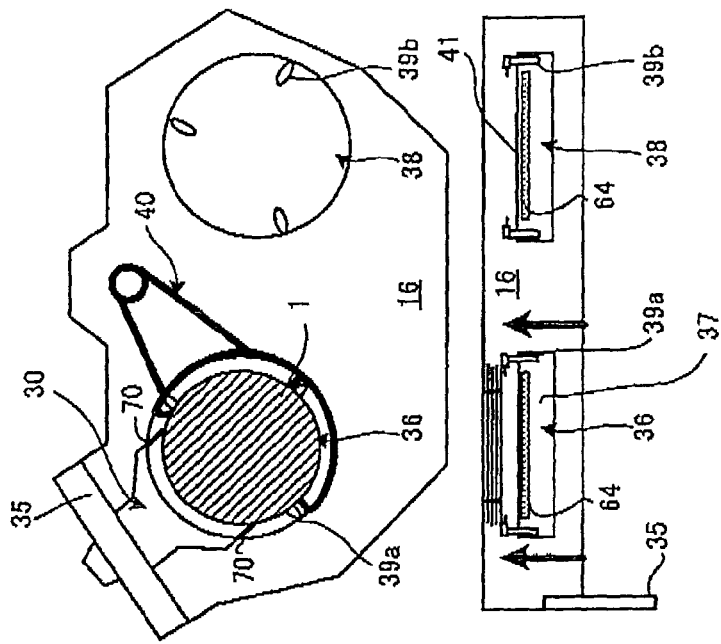
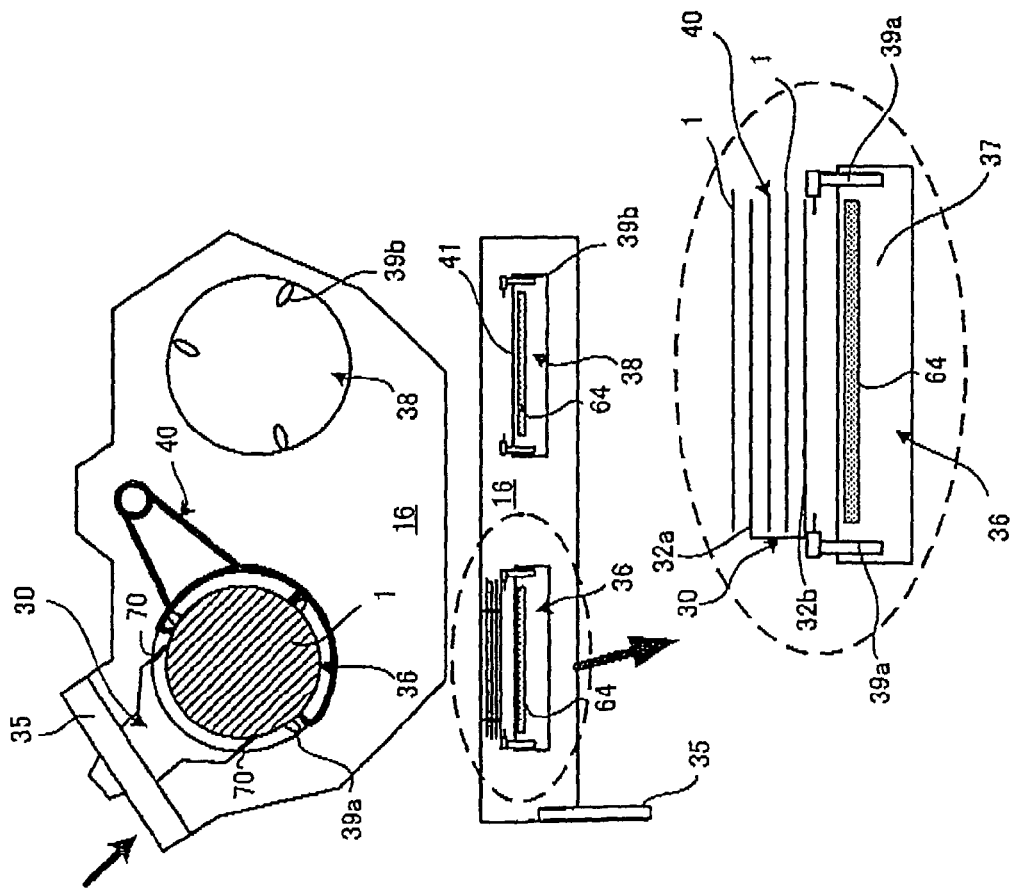
FIG. 6D
FIG. 6C

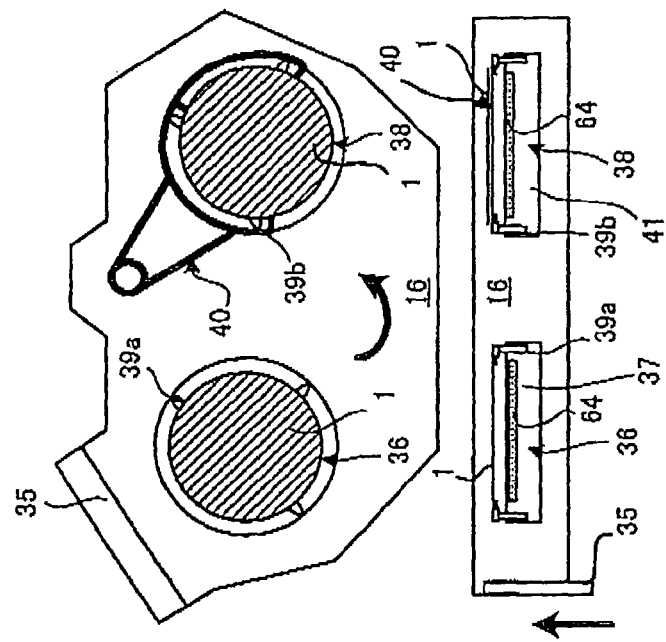
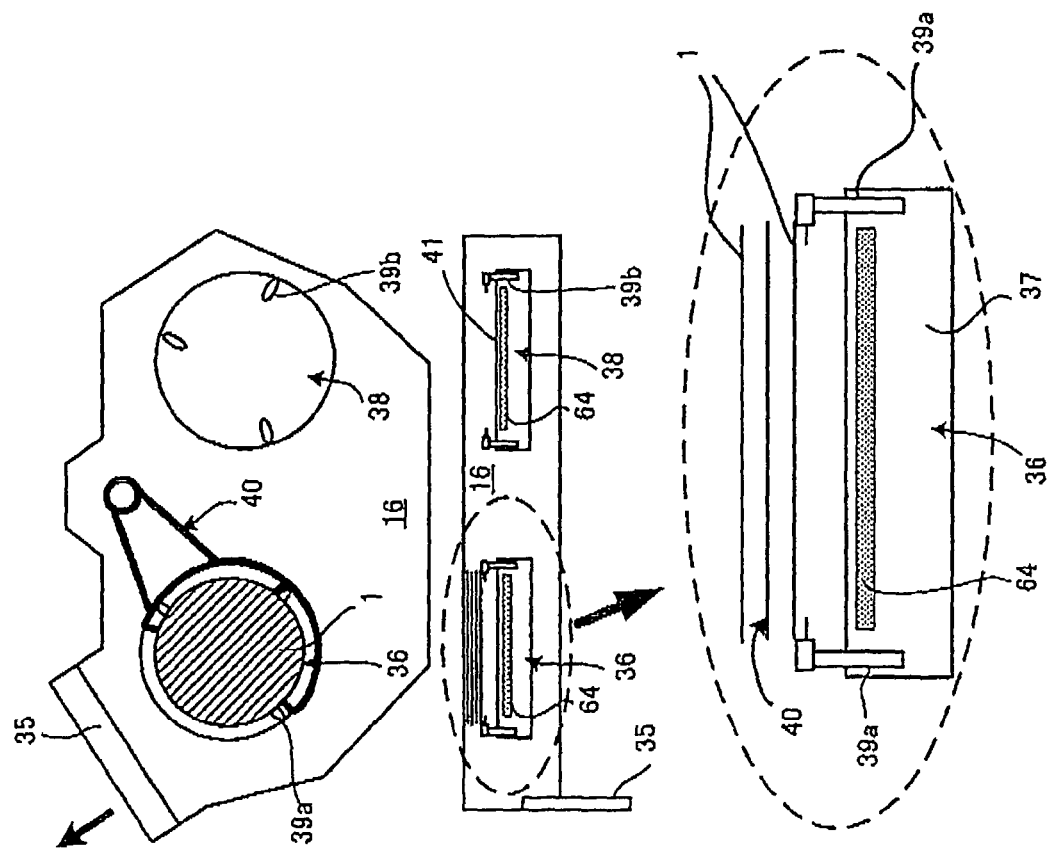
FIG. 6E
FIG. 6F

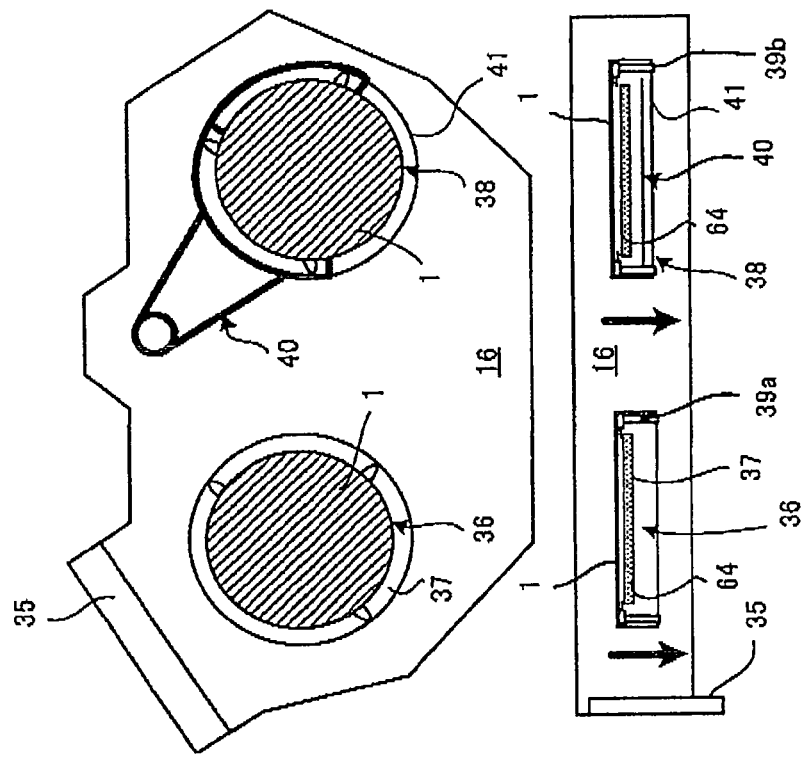
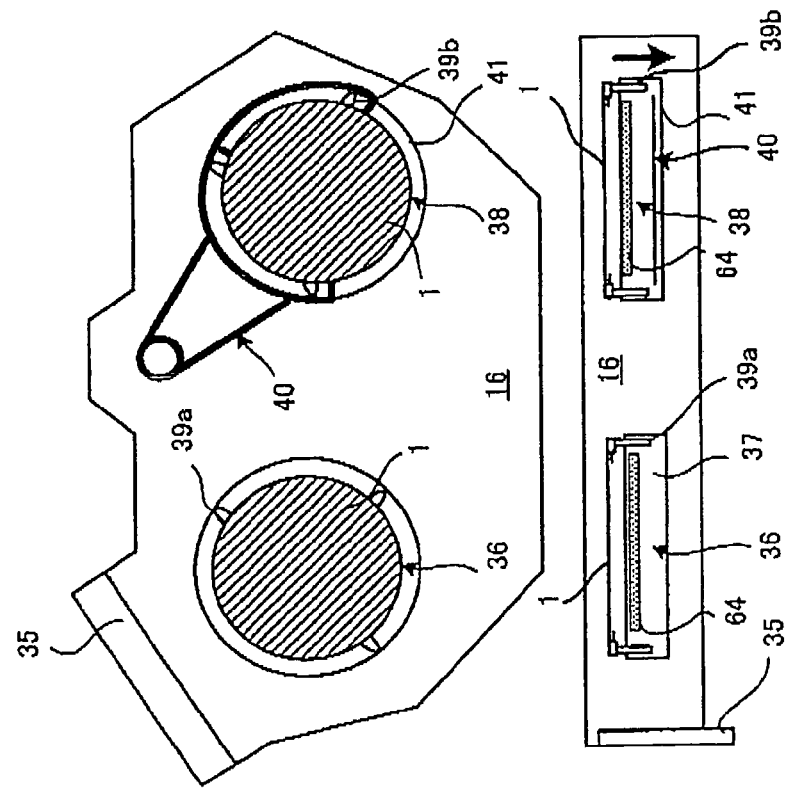

SUBSTRATE PROCESSING APPARATUS AND SUBSTRATE PROCESSING METHOD

BACKGROUND

1. Technical Field

The present invention relates to a substrate processing apparatus and a substrate processing method.

2. Related Art

As an example of a substrate processing apparatus, a wafer is transported via a load port, a load lock chamber, a transport chamber, and a processing chamber, and is processed in the processing chamber. The processing chamber is an independent space shielded by a gate valve, and it is possible to separately process the wafer in each of the chambers.

Generally, when a wafer is processed on a substrate placing base, only one wafer is processed in one chamber. In JP-A-2006-86180, a technique is disclosed in which wafers to be processed are alternately transported to a processing chamber, the processed wafer is replaced by the next wafer to be processed when the processed wafer is returned from each processing chamber to the substrate placing base.

The known substrate processing apparatus is provided with two load lock chambers for stocking wafers, one transports chamber having a robot for transferring the wafers to each chamber, and two processing chambers for processing the wafers. In this configuration for processing substrates, it is difficult to achieve a throughput of over 200 sheets per hour. When a processing chamber is simply added to an outer peripheral portion of the transport chamber to further improve the throughput, it is possible to improve the throughput. However, it is difficult to avoid the size of the transport robot in the transport chamber becoming relatively large, and the foot print being expanded when a further processing chamber is added.

SUMMARY OF THE INVENTION

An object of the invention is to provide a substrate processing apparatus and a substrate processing method capable of realizing the coexistence of contrary conditions of a high throughput and a reduced foot print.

According to an aspect of the invention, there is provided a substrate processing apparatus including a transport chamber, and a processing chamber that processes substrates, wherein the transport chamber has a first substrate transport member for transporting the substrates from the transport chamber to the processing chamber, and wherein the processing chamber has a first processing unit which is adjacent to the transport chamber and has a first substrate placing base, a second processing unit which is adjacent to the other side of the transport chamber in the first processing unit and has a second substrate placing base, a second substrate transport member transporting the substrates between the first processing unit and the second processing unit, and a control unit for controlling at least the second substrate transport member. The processing chamber has a first processing unit and a second processing unit, and each unit can process substrates at the same time. Accordingly, the number of processed substrates increases and throughput is improved than before. In addition, as a 4-reactor holding apparatus, it is possible to dispose the substrate processing apparatus with a reduced footprint as compared with a configuration of a product of another company.

According to another aspect of the invention there is provided a substrate processing method including the steps of supplying at least two substrates to a processing chamber having a first processing unit, a second processing unit, and a substrate placing base on which the substrates are placed, placing at least the two substrates respectively on a first substrate transport mechanism of the first processing unit and a second substrate transport mechanism of the second processing unit, and relatively controlling the first substrate transport mechanism, the second substrate transport mechanism, or the substrate placing base so that the distance between the first substrate transport mechanism and a heater provided in the substrate placing base and the distance between the second substrate transport mechanism and the heater provided in the substrate placing base become equal to each other, when the substrates are placed on the substrate placing base. With such a configuration, the distance between the substrate of the first processing unit and the heater and the distance between the substrate of the second processing unit and the heater become the same, the heat conditions become the same, and the substrate temperatures increase at the same ratio.

According to the invention, it is possible to realize the coexistence of contrary conditions of a high throughput and a reduced footprint.

BRIEF DESCRIPTION OF THE DRAWINGS

FIG. 6A to FIG. 6H are views illustrating the inside of the processing chamber according to the embodiment of the invention as viewed from above, which show the flow of wafer transferring.

DESCRIPTION OF PREFERRED EMBODIMENT

Hereinafter, preferred embodiments of the invention will be described with reference to the drawings.

Figure 1:
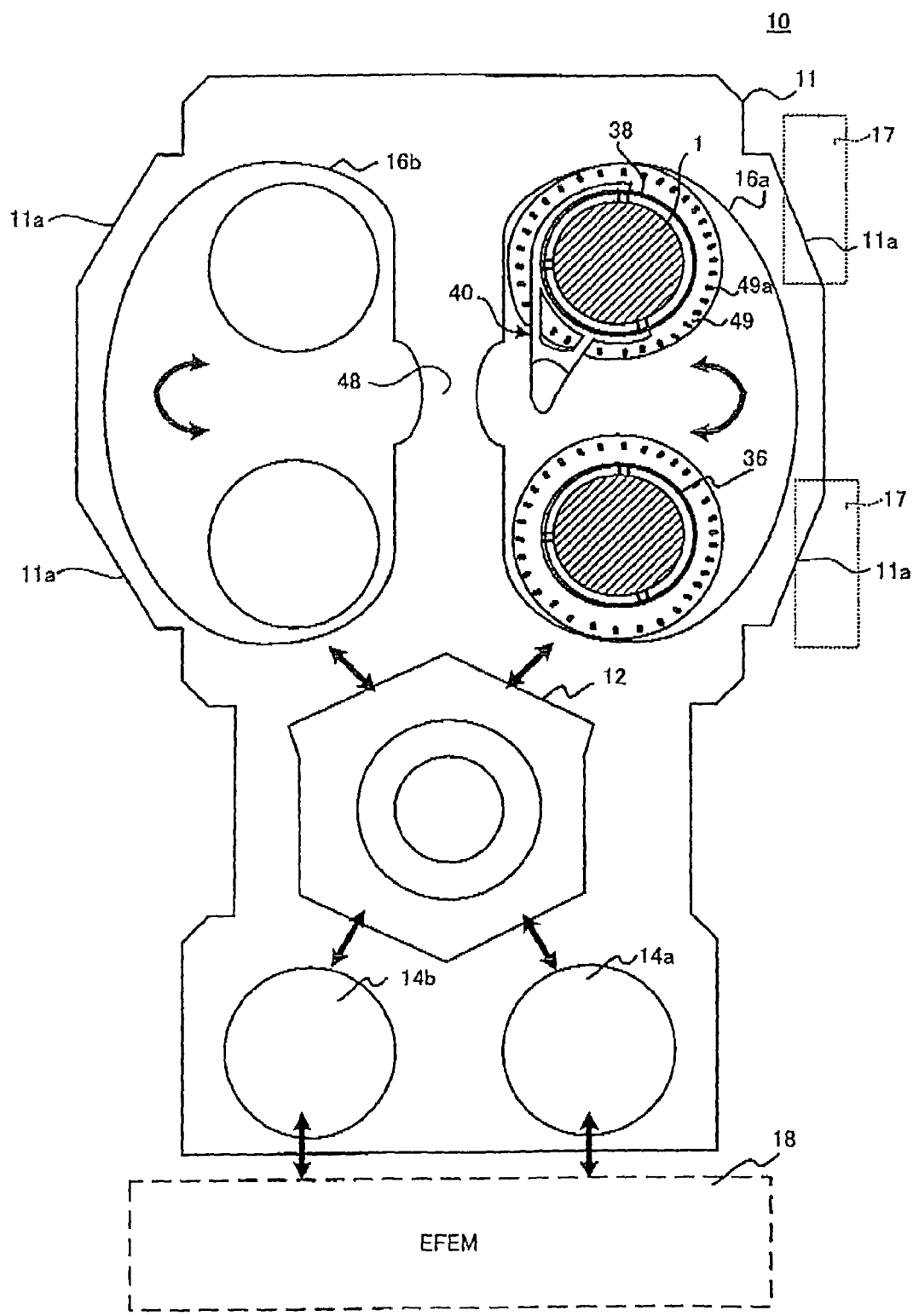
FIG. 1 is a view illustrating an overall configuration of a substrate processing apparatus according to an embodiment of the invention, which is a concept view as viewed from above.

FIG. 1 is a view illustrating an overall configuration of a substrate processing apparatus 10 according to the invention, which is a concept view as viewed from above the substrate processing apparatus 10.

For example, the substrate processing apparatus 10 is provided with two load lock chambers 14a and 14b and two processing chambers 16a and 16b centered on a transport chamber 12, and an EFEM (Equipment Front End Module) 18 is provided as a front module on the upstream side of the load lock chambers 14a and 14b.

The EFEM 18 has a structure capable of mounting three FOUPs (Front-Opening Unified Pod) (25 sheets) for stocking wafers 1. The EFEM 18 is provided with an atmospheric robot (not shown) capable of transferring a plurality of sheets (5 sheets) at the same time in the atmosphere, and thus it is possible to transfer the wafers from and to the two load lock chambers 14a and 14b. In addition, the substrate processing apparatus 10 is provided with a controller for controlling each unit.

Figure 2:
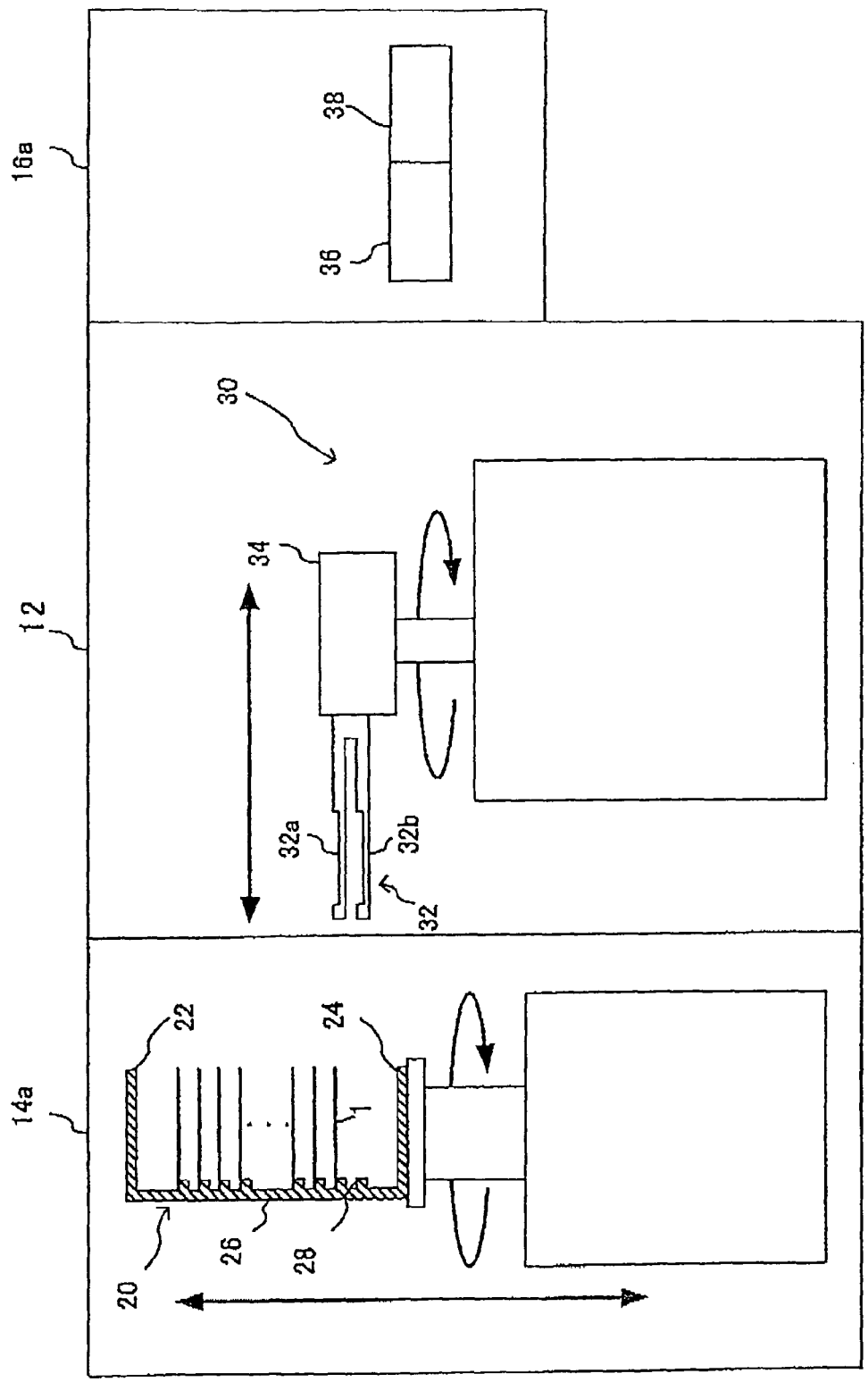
FIG. 2 is a longitudinal cross-section view of the substrate processing apparatus according to the embodiment of the invention.

As shown in FIG. 2, the load lock chambers 14a and 14b are provided with a substrate supporter (boat) 20 in which, for example, 25 substrates are housed lengthwise at regular intervals. The substrate supporter 20 is made of, for example, silicon carbide or aluminum, and has, for example, three pillars 26 connecting an upper plate 22 and a lower plate 24. In the lengthwise inside of the pillars 26, for example, twenty five placing portions 28 are formed in parallel. The substrate supporter 20 is configured to vertically move (up and down) in the load lock chambers 14a and 14b, and to turn about a turning shaft extending vertically.

Figure 3:
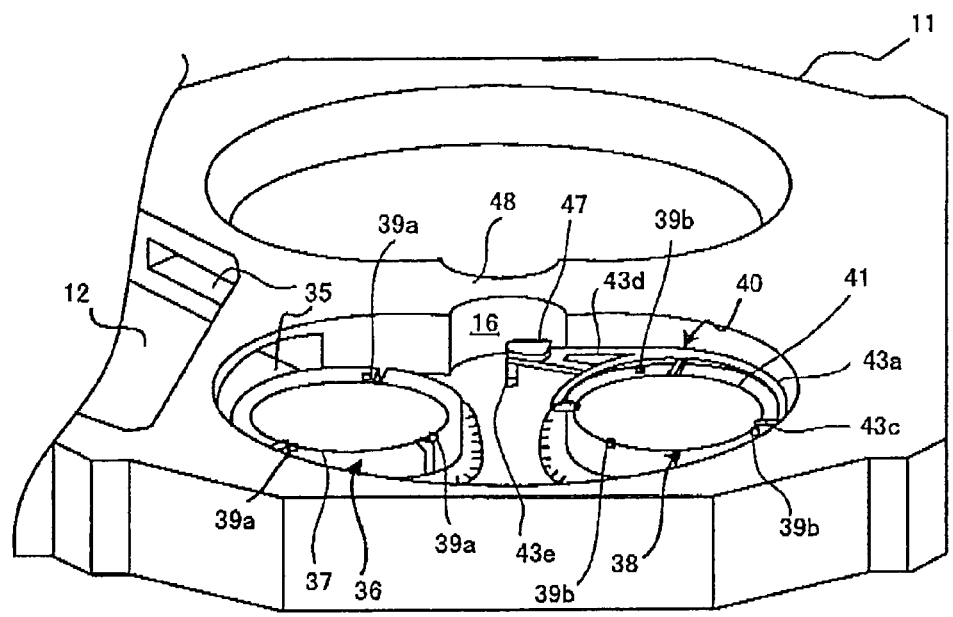
FIG. 3 is a perspective view illustrating a processing chamber of the substrate processing apparatus according to the embodiment of the invention.

The transport chamber 12 is provided with a first substrate transport member 30 transporting the wafers 1 between the load lock chambers 14a and 14b and the processing chambers 16a and 16b. The first substrate transport member 30 has an arm 34 provided with a finger pair 32 including an upper finger 32a and a lower finger 32b. The upper finger 32a and the lower finger 32b have, for example, the same shape, are separated by a predetermined vertical interval, extend substantially horizontally in the same direction from the arm 34, and support the wafers 1. The arm 34 is configured to turn about a turning shaft extending vertically, and to move horizontally. As shown in FIG. 3, the transporting chamber 12 and the processing chamber 16a, and the transporting chamber 12 and the processing chamber 16b are in communication with each other via gate valves 35, respectively. A boundary wall is formed between the processing chambers 16a and 16b, therefore each the processing chambers are made independent atmosphere.

Accordingly, wafers to be processed stocked in the load lock chambers 14a and 14b are transferred two by two at the same time to the processing chambers 16a and 16b through the gate valve 35 by the first substrate transport member 30 disposed on the transport chamber 12, and the processed wafers are transferred two by two at once from the processing chambers 16a and 16b to the load lock chambers 14a and 14b by the first substrate transport member 30 (first substrate transport mechanism).

In FIG. 3, an outline of the processing chamber 16 is shown. In the processing chamber 16, two substrate placing bases are disposed. One substrate placing base of the first processing unit 36 close to the transport chamber 12 is a first substrate placing base 37, and the other substrate placing base of the second processing unit 38 is a second substrate placing base 41. The first processing unit 36 and the second processing unit 38 have structures independent from each other, and are provided in a line in the same direction as a wafer processing flow direction in the overall view. That is, the second processing unit 38 is provided away from the transport chamber 12 with the first processing unit 36 therebetween. The substrate is processed by the same process in the first processing unit 36 and the second processing unit 38. The first processing unit 36 and the second processing unit 38 communicate with each other, and the temperature in the processing chamber 16 can be raised up to 300° C. In the first substrate placing base 37 and the second substrate placing base 41, a heater 64 is provided therein to heat them. The first substrate placing base 37 and the second substrate placing base 41 are made of, for example, aluminum (A5052, A5056, etc.).

To reduce footprint space and reduce cost, the load lock chambers 14a and 14b, the transport chamber 12, and the processing chambers 16a and 16b may be made of, for example, aluminum (A5052) as a single part.

A second substrate transport member 40 is provided on the inside between the first processing unit 36 and the second processing unit 38 in the processing chamber 16, in other words, near the boundary wall 48 side. The second substrate transport member 40 rotates by centering on a shaft portion 43e and the shaft portion 43e is arranged in the boundary wall 48 side. The second substrate transport member 40 in the other processing chamber places the boundary wall 48 and is arranged contrasting it with the second substrate transport member 40 in the one processing chamber. It becomes possible to set the lower side of the processing chamber, and to the center of the device in horizontal direction, that is, the vicinity of the boundary wall, by concentrating wiring to control the second substrate transport member 40 to arrange it contrasting it. This result, it becomes possible to install by concentrating the wirings of each parts, and the wiring space can be made efficiency. Also, because the second substrate transport member 40 rotates by centering on the shaft portion 43e arranged in the vicinity of the boundary wall 48, the processing chamber externals can be assumed to be a circle. As a result, it becomes possible to make the shape 11a of the main body 11 diagonally and the maintenance space that those who maintain it enter can be secured more greatly. If the shaft portion 43e arranged in the outside of the processing chamber 16, it becomes impossible to make the shape 11a of the main body 11 diagonally and the maintenance space that those who maintain it enter can not be secured more greatly. The second substrate transport member 40 transfers one of two wafers to be processed transported by the first substrate transport member 30, to the second substrate placing base 41 of the second processing unit 38, and then transfers the processed wafer on the second substrate placing base 41 onto the fingers of the first substrate transport member 30 (second substrate transport mechanism).

Figure 4:
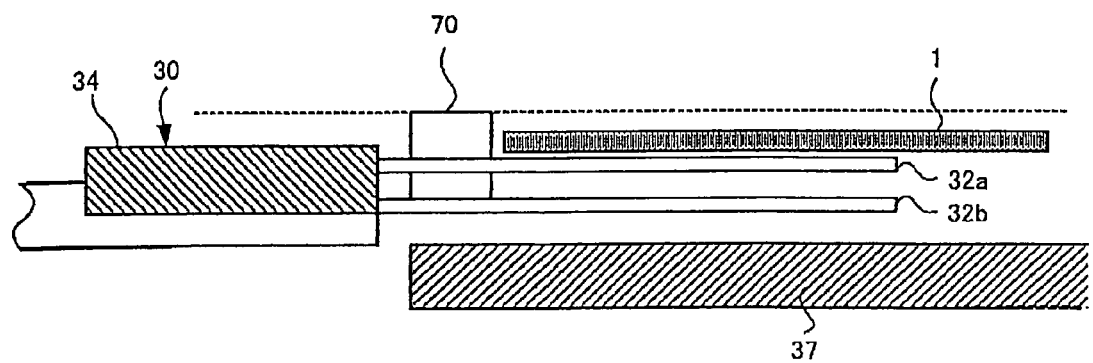
FIG. 4 is a view for explaining a positional relationship between a wafer and a wafer stopper of the substrate processing apparatus according to the embodiment of the invention.

FIG. 4 is a side view of the periphery of the first substrate transport member 30. The upper finger 32a and the lower finger 32b that is near to the arm 34 of the first substrate transport member 30 is provided with a wafer stopper 70 that is a substrate stopping member lengthening from the lower finger 32b to the upper side of a perpendicular direction. The wafer stopper 70 is, for example, it is possible to use it as an arrangement plate that substrate is made to line up in vertical direction. The wafer stopper 70 is formed along an outward form of the first substrate transport member 30. As shown in FIG. 4, an upper end face of the wafer stopper 70 is disposed above the upper face of the wafer 1 on the upper finger 32a of the first substrate transport member 30. Accordingly, even when the second substrate transport member 40 turns and overruns, the wafer 1 is stopped by the wafer stopper 70 and the wafer 1 can be prevented from getting on the wafer stopper 70. In addition, the wafer stopper 70 is disposed at a position where the wafer stopper 70 does not interfere with the second substrate transport member 40. The wafer 1 is prevented from deviating from the first substrate transport member 30 and from being placed on the first substrate placing base 37, by the wafer stopper 70. The wafer stopper 70 is disposed at the position where the wafer stopper 70 does not interfere with the second substrate transport member 40, thereby providing the first substrate transport member 30 and the second substrate transport member 40 on the first substrate placing base 37 of the first processing unit 36 at once. Accordingly, it is possible to improve the throughput.

Figure 5:
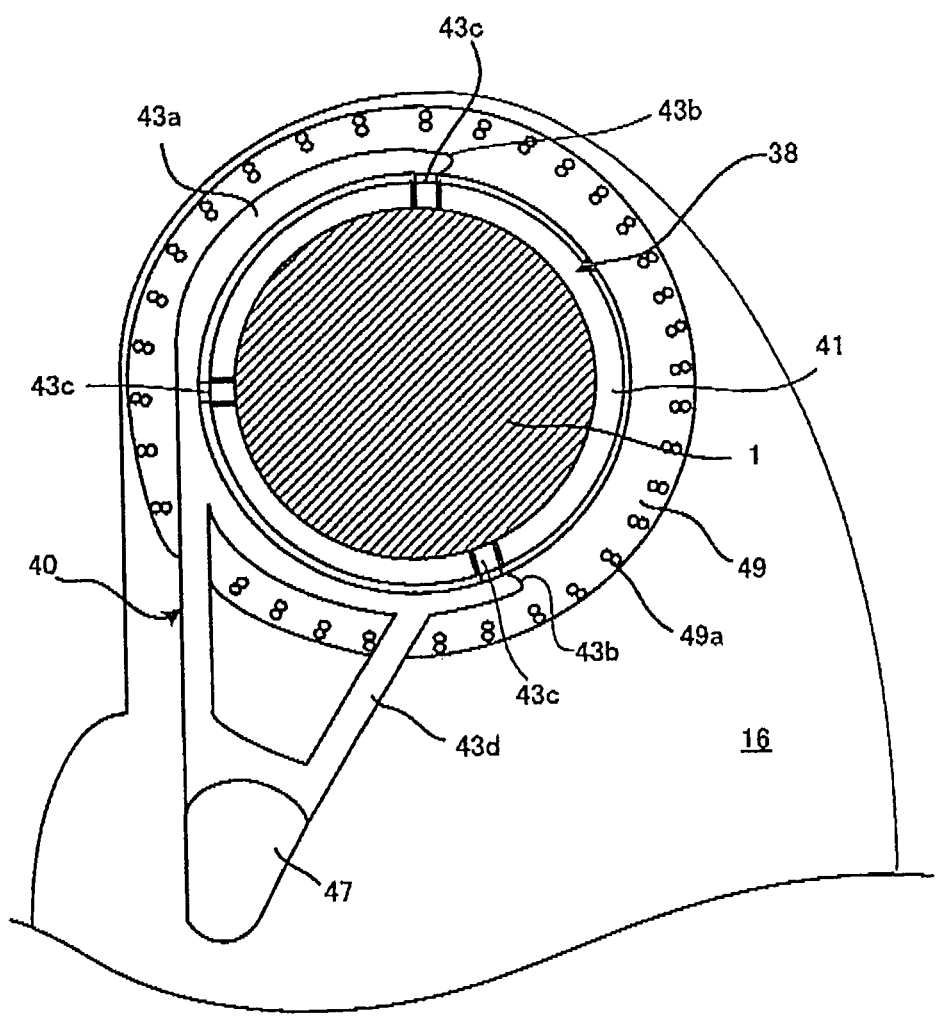
FIG. 5 is a view illustrating the vicinity of a second substrate transport member at the time of processing a substrate according to the embodiment of the invention as viewed from above.

FIG. 5 shows a state where the second substrate transport member 40 in the processing chamber 16 waits close to the second processing unit 38 (substrate processing time). The second substrate transport member 40 has an arm 47 having a circular arc portion 43a which is larger than an outer diameter of the wafer, a cutting lack portion 43b lacked by the circular arc portion 43a, a claw portion 43c for placing the wafer provided substantially horizontally toward the center of the circular arc portion 43a from the circular arc portion 43a, and a frame portion 43d supporting the circular arc portion 43a.

The circular arc portion 43a and the frame portion 43d are formed continuously, are mounted substantially horizontally from an arm 47, and are configured to support the wafer 1 through the claw portion 43c.

The arm 47 is configured to move up and down vertically and to turn about a shaft portion 43e which extends vertically and which is used as a turning shaft. The cutting lack portion 43b is provided at a portion facing the gate valve 35 provided between the transport chamber 12 and the processing chamber 16 when the shaft portion 43e turns, and is close to the first processing unit 36. Accordingly, the second substrate transport member 40 moves up and down by the turning of the shaft portion 43e used as the turning shaft. With such an operation, one wafer 1 out of the two wafers 1 transported into the processing chamber 16 by the first substrate transport member 30 can be transported and disposed from the upper portion of the first processing unit 36 to the second processing unit 38 away from the transport chamber 12. The second substrate transport member 40 is heated to a high temperature (about 250° C.) by the radiation of heat from the first substrate placing base 37 and the second substrate placing base 41, and thus preferably, the second substrate transport member 40 is made of, for example, alumina ceramics (purity 99.6% or more), quartz, SiC (silicon carbide), AlN (aluminum nitride), and the like having plasma resistance and high temperature resistance. When the second substrate transport member 40 is made of, for example, alumina ceramics (purity 99.6% or more) having a coefficient of heat expansion smaller than that of a metal component, it is possible to prevent deterioration of the reliability of transportation caused by deflection or the like resulting from thermal deformation. However, a base portion of the second substrate transport member 40 is made of a metal component for adjusting position and level.

The first substrate placing base 37 and the second substrate placing base 41 are fixed to a main body 11 of the apparatus by a fixing member (not shown) in the processing chamber 16. Three first substrate holding pins 39a that are substrate holding units are vertically pierced into an outer periphery of the first substrate placing base 37, and the substrate is moved up and down substantially horizontally by moving the substrate holding pins up and down. Three second substrate holding pins 39b are vertically pierced into an outer periphery of the second substrate placing unit 41, and the substrate is moved up and down substantially horizontally by moving the substrate holding pins up and down. Accordingly, the wafer transported through the gate valve 35 by the first substrate transport member 30 is placed on the substrate placing base through the substrate holding pins 39a and 39b. That is, the controller controls a motor to turn back and forth, thereby moving the first substrate holding pins 39a and the second substrate holding pines 39b up and down.

FIG. 6A to FIG. 6H show an outline of the flow of wafer transferring in the processing chamber 16. In FIG. 6A to FIG. 6H, the top figures are views from above the processing chamber 16. The bottom figures are cross-section views of the top figures for explanation. In the bottom figures, one substrate holding pin 39a is provided at a position close to the gate valve 35 in the first processing unit 36 for the purpose of explanation. Actually, as shown in the top figures, the substrate holding pin 39a is not provided at a position close to the gate valve 35 in the first processing unit 36, that is, a position where the first substrate transport member 30 waits like the top figure in FIG. 6C.

First, a vacuum is created in the inside of the processing chamber 16 at the same pressure as that of the transport chamber 12. In the following description, the operation of each unit constituting the substrate processing apparatus 10 is controlled by the controller.

(Step 1, FIG. 6A)

The gate valve 35 is opened, and the first substrate holding pins 39a of the first substrate placing base 37 and the second substrate holding pins 39b of the second substrate placing base 41 are moved up. The second substrate transport member 40 waits close to the second processing unit 38, and is moved up with the first substrate holding pins 39a and the second substrate holding pins 39b.

(Step 2, FIG. 6B)

The second substrate processing member 40 is moved substantially horizontally toward the first processing unit 36 by turning the shaft portion 43e. At this time, the cutting lack portion 43b of the second substrate transport member 40 faces the gate valve 35.

(Step 3, FIG. 6C)

While the first substrate transport member 30 transports two wafers placed on an upper finger 32a and a lower finger 32b, the first substrate transport member 30 moves from the transport chamber 12 to the processing chamber 16 through the gate valve 35. Then, the first substrate transport member 30 stops above the first processing unit 36. At that time, the second substrate transport member 40 waits at a position high enough to be inserted between the upper finger 32a and the lower finger 32b of the finger pair 32. Since the wafer stopper 70 is set higher than the wafer height at the time of turning, the wafer overrunning is suppressed. In addition, the wafer stopper 70 is provided at the near the arm 34 of the upper finger 32a and the lower finger 32b, thereby preventing interference with the wafer 1 at the time of turning.

(Step 4, FIG. 6D)

In a state where the first substrate transport member 30 is not operated as it is, the first substrate holding pins 39a of the first substrate placing base 37 moves up, and the wafer placed on the lower finger 32b is placed on the first substrate holding pins 39a. When the second substrate transport member 40 moves up, the wafer placed on the upper finger 32a is placed on the claw portion 43c of the second substrate transport member 40.

(Step 5, FIG. 6E)

The first substrate transport member 30 returns into the transport chamber 12. In this case, the interference with the wafer 1 even at the time of contraction operation of the first substrate transport member 30, by the wafer stopper 70.

(Step 6, FIG. 6F)

The second substrate transport member 40 with the wafer 1 placed thereon moves substantially horizontally toward the second processing unit 38 by the turning of the shaft portion 43e. The gate valve 35 is closed.

(Step 7, FIG. 6G)

When the shaft portion 43e moves down, the second substrate transport member 40 moves to an outer peripheral lower portion of the second substrate placing base 41. Since the second substrate transport member 40 waits in the processing chamber 16 in the course of processing the wafer, the second substrate transport member 40 disturbs the flow of the processing gas (e.g., $O_2$ radicals, etc.) supplied from the upper portion of the second processing unit 38 and thus uniformity on the surface of the wafer may deteriorate. For this reason, the second substrate transport member 40 moves to a height where the gas flow from the outer periphery of the second substrate placing base 41 is not disturbed.

(Step 8, FIG. 6H)

The first substrate holding pins 39a of the first substrate placing base 37 and the second substrate holding pins 39b of the second substrate placing base 41 move down substantially at the same time with the wafer 1 held substantially horizontally, and the wafer 1 is placed on the first substrate placing base 37 and the second substrate placing base 41. That is, the wafers are moved down so that the distance between one wafer and the substrate placing base corresponding to that wafer and the distance between the other wafer and the substrate placing base corresponding to that wafer become equal.

The reason is that thermal influences on the wafers of the first processing unit 36 and the second processing unit 38 are made equal. For example, the ashing rate of each wafer Can be made uniform by the same thermal influence. When the substrate processing is CVD (Chemical Vapor Deposition), each film thickness can be assumed to be almost the same thickness.

The thermal influences are, not necessarily made completely equal, and there may be a difference which is acceptable as long as the ashing rates and the film thickness are uniform. The difference at time that each wafer is placed is, for example, about 2 seconds. The heaters 64 may be separately controlled instead of moving down the first substrate holding pins 39a and the second substrate holding pins 39b substantially at the same time so as to make the thermal influences equal.

In the apparatus, the substrate holding pins 39 are moved down, but the first substrate placing base 37 and the second substrate placing base 41 may be configured to move up and down.

Then, gas is supplied into the processing chamber 16, and a plasma generating process (ashing process) is performed. After processing the substrate, the reverse sequence is performed so as to take the substrate out.

Figure 7:
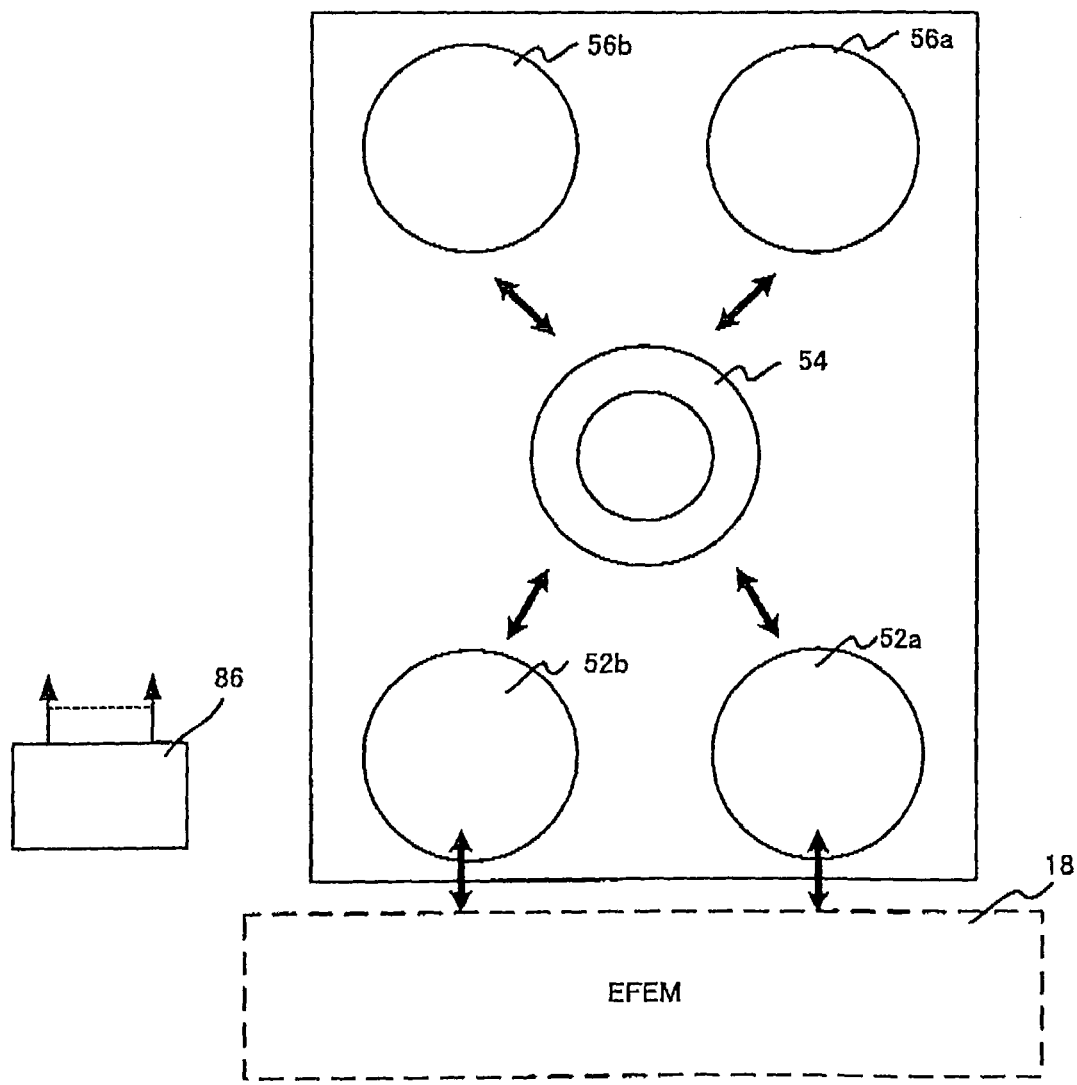
FIG. 7 is a view illustrating an overall configuration of a substrate processing apparatus according to a comparative example, which is a concept view as viewed from above.
Figure 8A:
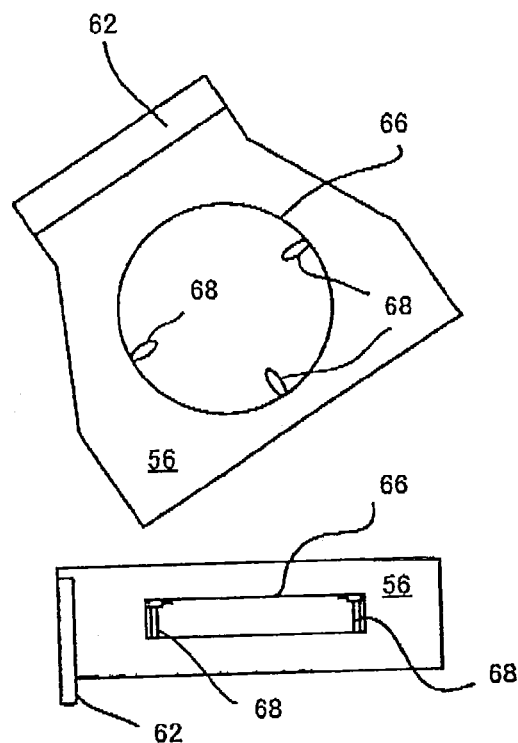
FIG. 8A to FIG. 8F are views illustrating the inside of a processing chamber of the substrate processing apparatus according to the comparative example as viewed from above, which show the flow of wafer transferring.
Figure 8B:
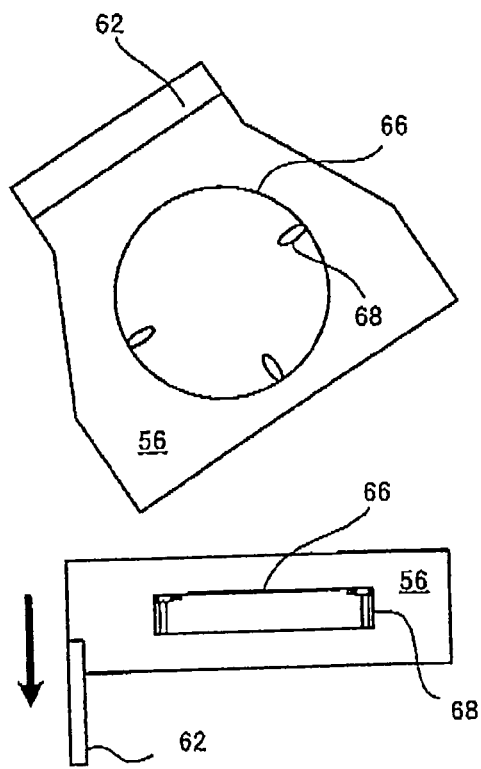
Figure 8C:
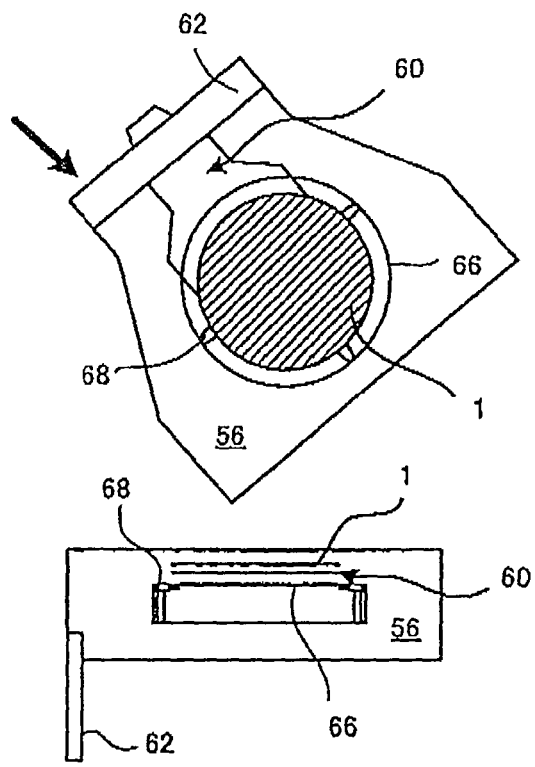
Figure 8D:
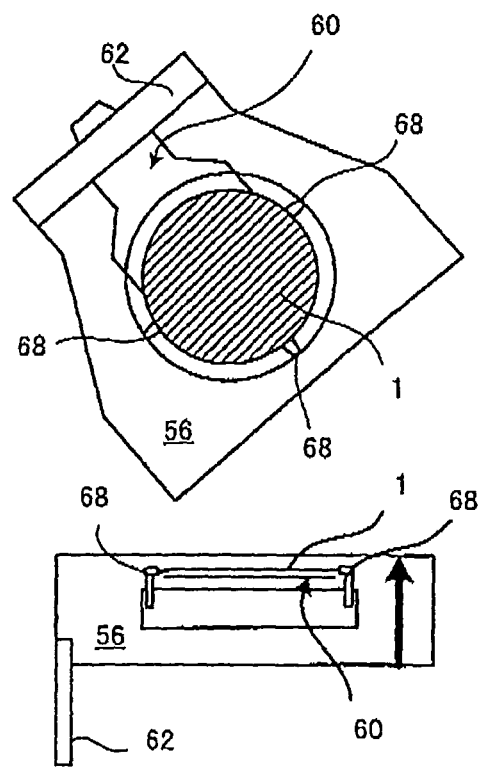
Figure 8E:
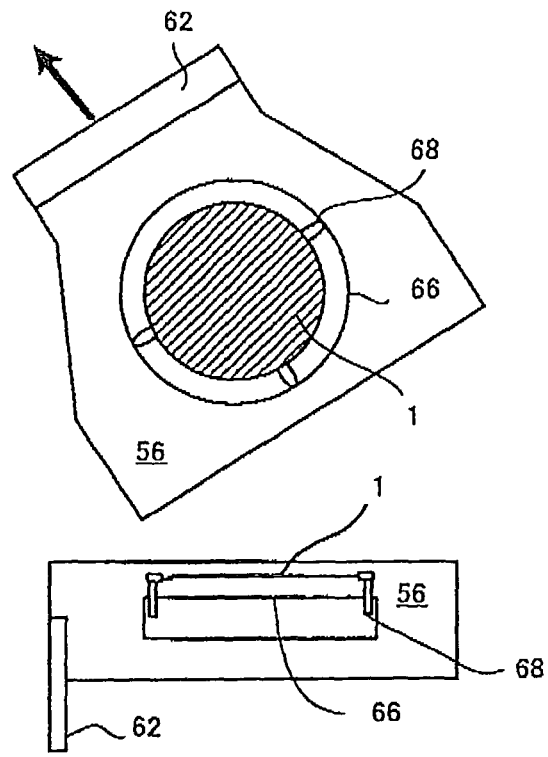
Figure 8F:
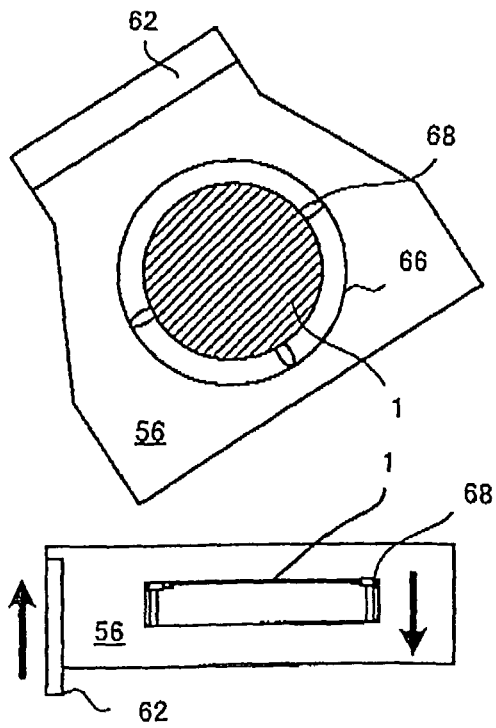

FIG. 7 shows an overall configuration of a substrate processing apparatus 50 according to a comparative example, which is a concept view as viewed from above the apparatus 50. The substrate processing apparatus 50 according to the comparative example is provided with two load lock chambers 52 for stocking wafers, one transport chamber 54 having a robot for transferring the wafer to each chamber, and two processing chambers 56 for processing the wafers. According, only one wafer is processed in one processing chamber.

FIG. 8A to FIG. 8F show an outline of the flow of wafer transferring in the processing chamber 56 of the substrate processing apparatus 50 according to the comparative example.

In the following description, the operation of each unit constituting the substrate processing apparatus 50 according to the comparative example is controlled by a controller 86.

First, a vacuum is created in the inside of the processing chamber 56 at the same pressure as that of the transport chamber 54.

(Step 1)

A gate valve 62 is opened.

(Step 2)

While a third substrate transport member 60 transports the wafer 1, the third substrate transport member 60 moves from the transport chamber 54 into the processing chamber 56 through the gate valve 62. Then, the third substrate transport member 60 stops above a substrate placing base 66. In this case, the third substrate transport member 60 can transport the wafers one by one.

(Step 3)

In a state where the third substrate transport member 60 is not operated as it is, substrate holding pins 68 move up, and the wafer 1 is placed on the substrate holing pins 68.

(Step 4)

The third substrate transport member 60 returns into the transport chamber 54.

(Step 5)

The substrate holding pins 68 moves down with the wafer 1 held substantially horizontally, and the wafer 1 is placed on the substrate placing base 66, thereby completing the placing of the wafer. The gate valve 62 is closed.

Then, gas is supplied into the processing chamber 56, and a plasma generating process (ashing process) is performed. After processing the substrate, the reverse sequence is performed so as to take the substrate out.

Figure 9:
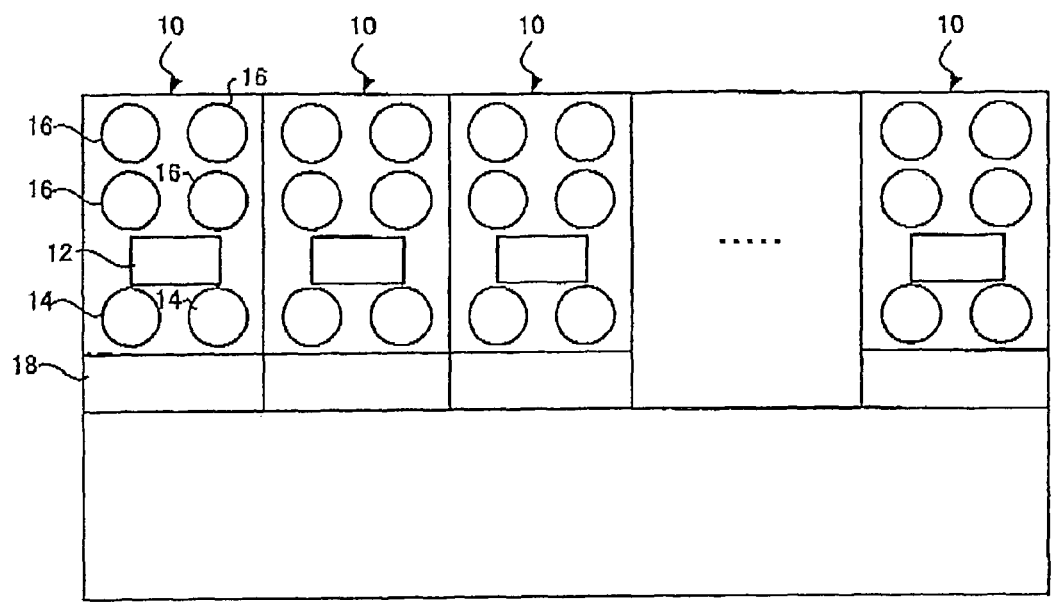
FIG. 9 is a view illustrating a dispositional example of the substrate processing apparatus 10 according to the embodiment of the invention.

According to the invention as described above, it is possible to dispose the apparatus with a reduced footprint as compared with the substrate processing apparatus 50 according to the comparative example as the 4-reactor holding apparatus. As shown in FIG. 9, according to the substrate processing apparatus 10 according to the embodiment of the invention, the plurality of processing chambers 16 having an inward depth are provided without the processing chamber 16 for transversely moving the wafer 1, and thus the transverse width of the apparatus 10 can be reduced. Therefore, a large number of apparatuses 10 can be disposed. According to the invention, since the second substrate transport member 40 is provided in addition to the first substrate transport member 30, the separate operations of the first substrate transport member 30 and the second substrate transport member 40 can be performed at the same time. Accordingly, it is possible to achieve a high throughput. Moreover, since the second substrate transport member 40 is provided in the processing chamber 16, it is possible to transport the wafer while maintaining the decompression and high temperature in the processing chamber 16. When the second substrate transport member 40 is made of, for example, alumina ceramics, the process can be performed with the second substrate transport member 40 remaining in the processing chamber 16. In addition, since the configuration of the existing substrate processing apparatus is used, it is possible to reduce changes to the apparatus.

Consequently, according to the invention, it is possible to double the throughput while keeping a reduced footprint layout.

Figure 10:
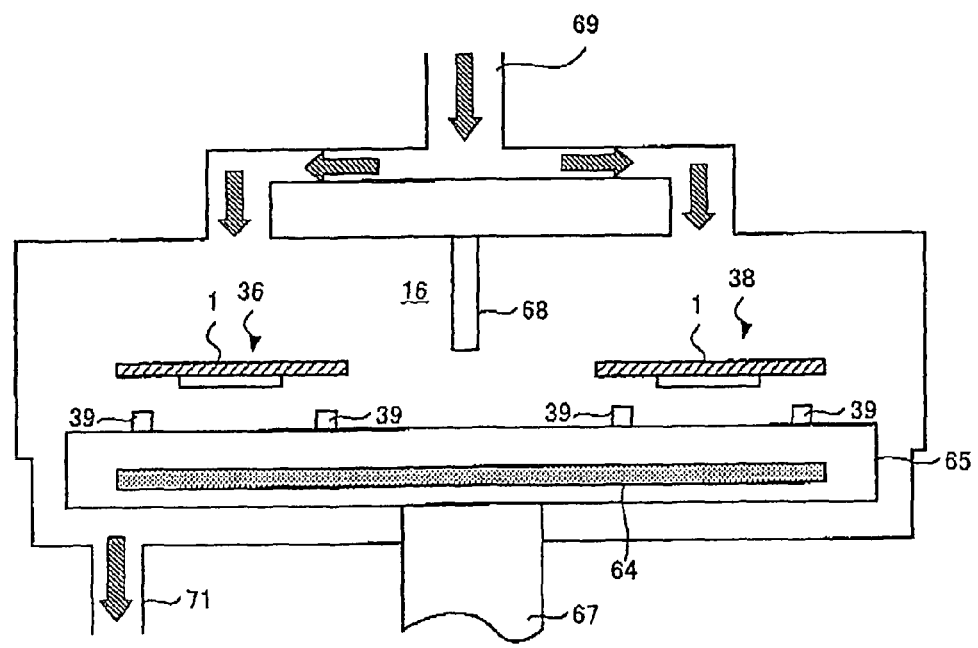
FIG. 10 is a view illustrating a substrate processing apparatus according to a second embodiment of the invention.

A second embodiment of the invention will be described with reference to FIG. 10.

In a substrate processing apparatus according to the second embodiment, the above-described first substrate placing base 37 and second substrate placing base 41 are formed of one sheet of substrate placing base 65. At the center of the processing chamber 16, a partition 68 is formed, and the first processing unit 36 and the second processing unit 38 are formed. At the upper parts of the first processing unit 36 and the second processing unit 38, processing gas is supplied from a gas supply pipe 69, and the processing gas is discharged from a gas discharge pipe 71. The substrate placing base 65 is provided with a heater 64 therein. At the center of the substrate placing base 65, an elevating mechanism 67 moving the substrate placing base 65 up and down is provided. In this case, a distance between a wafer 1 of the first processing unit 36 and the heater 64 and a distance between a wafer 1 of the second processing unit 38 and the heater 64 become the same by moving the substrate placing base 65 up.

According to the second embodiment, since the elevation mechanism 67 is provided at the center of the main body of the apparatus, it is possible to move the substrate placing base 65 up and down with the simple configuration with good balance. Accordingly, no difference occurs in the distances from the wafers 1. That is, heat influences of the first processing unit 36 and the second processing unit 38 on the wafers become the same, and the ashing rates can be made uniform.

If two substrate placing bases are moved up, an elevation mechanism of the substrate placing base is necessary for each substrate placing base and a cost is increased. In addition, it is necessary to adjust the distance between the heater 64 and the wafer 1 of each substrate placing base, a maintenance work is increased, and a maintenance cost is increased. Moreover, when one heater is provided in one substrate placing base, only one heating control unit of the heater is necessary. Accordingly, it is possible to reduce a cost and to simply control the heater.

Figure 11:
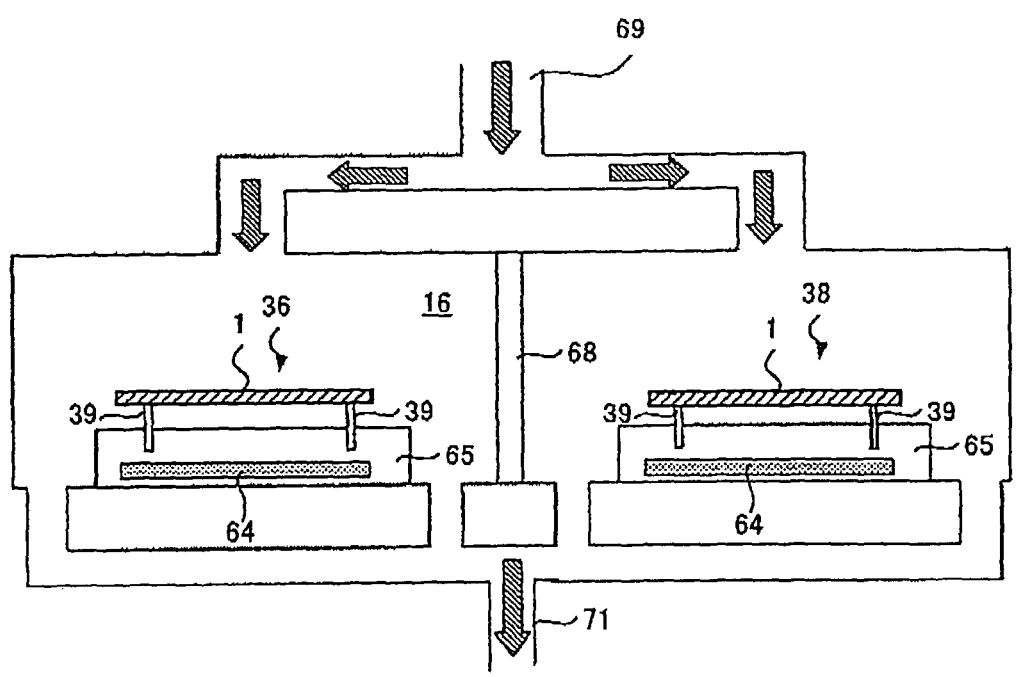
FIG. 11 is a view illustrating a substrate processing apparatus according to a third embodiment of the invention.

A third embodiment of the invention will be described with reference to FIG. 11. A substrate processing apparatus according to the third embodiment is provided with two substrate placing bases 65, and heaters 64 are provided in the two substrate placing bases 65, respectively. The processing chamber 16 is completely covered with a partition 68 from the center of the processing chamber 16, thereby configuring the first processing unit 36 and the second processing unit 38. At the upper parts of the first processing unit 36 and the second processing unit 38, processing gas is supplied from a gas supply pipe 69, and the processing gas is discharged from a gas discharge pipe 71.

In the third embodiment, the substrate holding pins 39 of the two substrate placing bases 65 are moved down at once so that the distance between the wafer 1 of the first processing unit 36 and the heater 64 and the distance between the wafer 1 of the second processing unit 38 and the heater 64 become the same, in other words, so that the heat influence level to each wafer become the same, as in the embodiment of the invention. According to the third embodiment of the invention, since the processing chamber 16 is covered, plasma is uniformly applied to the wafer 1.

Accordingly, the first processing unit 36 and the second processing unit 38 are exposed to the plasma at the same temperature and under the same condition, and thus it is possible to perform a uniform plasma process to the wafer.

In addition, the present invention is not limited to plasma processor that processes the substrate by plasma and can be applied also to a semiconductor producing technique, and particularly, to a heat treatment technique for performing a process in a state where the substrate to be processed is housed in a processing chamber and is heated by a heater. The invention can be effectively applied to, for example, a substrate processing apparatus used for an oxidization process or diffusion process of a semiconductor wafer in which a semiconductor integrated circuit device (semiconductor device) is built therein, annealing or reflowing for carrier activation or leveling after ion injection, a film forming process by a heat CVD reaction, and the like.

According to an aspect of the invention, there is provided a substrate processing apparatus including a transport chamber, and a processing chamber that processes substrates, wherein the transport chamber has a first substrate transport member for transporting the substrates from the transport chamber to the processing chamber, and wherein the processing chamber has a first processing unit which is adjacent to the transport chamber and has a first substrate placing base, a second processing unit which is adjacent to the other side of the transport chamber in the first processing unit and has a second substrate placing base, a second substrate transport member transporting the substrates between the first processing unit and the second processing unit, and a control unit for controlling at least the second substrate transport member. Accordingly, throughput is improved than before.

Preferably, at least two processing chambers are provided on one surface of the transport chamber. Accordingly, improvement of throughput and Cost of Ownership (CoO) can coexist.

Preferably, at least two processing chambers are provided in the same longitudinal direction of the processing chambers as viewed from the transport chamber. Accordingly, improvement of throughput and Cost of Ownership (CoO) can coexist.

Preferably, the processing chamber of the first processing unit and the processing chamber of the second processing unit communicate with each other, the second substrate transport member has a shaft portion, a circular arc portion for placing the substrates, and a cutting lack portion lacked by the circular arc portion, a shaft portion is configured to turn and vertically move up and down, and the cutting lick portion is configured to face a gate valve formed between the transport chamber and the processing chamber. Accordingly, the substrate can be transported/placed from the other unit to the other unit in the processing chambers communicate with each other. Moreover, when the substrate is processed, it does not disturb the flow of the processing gas because the second substrate transport member moves down.

Preferably, the first processing unit has a substrate holding portion for moving the substrates up and down horizontally. Accordingly, the heat influences of the substrate become the same because the substrate holding portion moves up and down horizontally.

Preferably, the control unit controls the substrate so as to temporarily wait at a desired distance from an upper surface of the first substrate placing base having a first heater provided in the first processing unit by the substrate holding portion, and controls the substrate to wait at the desired distance from an upper surface of the second substrate placing base having a second heater provided in the second processing unit by the second substrate transport member. Accordingly, the heating situation from the heater is assumed to be the same by waiting by on each heater and the heat influences of the substrate become the same.

Preferably, after the substrates wait in the first substrate placing base and the second substrate placing base, the control unit controls the first substrate placing base and the substrate placed on the first substrate holding base to move down by the substrate holding portion and controls the second substrate placing base and the substrate placed on the second substrate placing base to move down by the second substrate transport member, and the control unit controls the distance between the first substrate placing base and the substrate placed on the first substrate placing, base and the distance between the second substrate placing base and the substrate placed on the second substrate placing base so as to be equal to each other. Accordingly, the heat condition is the same because the distance between each substrate and each heater become the same and the heat influences of the substrate become the same.

Preferably, the first substrate transport member and the second substrate transport member are configured to wait on the upper surface of the first substrate placing base provided in the first processing unit and having the first heater, and the first substrate placing base has a substrate stopping member at a position not in contact with the second substrate transport member. Accordingly, the substrate can be transported by high throughput because the first substrate transport member and the second substrate transport member are waited on the unit at once and the substrate is transferred.

Preferably, an upper end of the substrate stopping member is located above the substrate placed on the second substrate transport member. Accordingly, the substrate can be prevented being damaged because the substrate is prevented from flying out from the substrate placed.

According to another aspect of the invention, there is provided a substrate processing apparatus including a processing chamber that has a first processing unit and a second processing unit for processing substrates, at least one substrate placing base that is provided in the processing chamber and has a heater for heating the substrates, a first substrate transport mechanism that is provided in the first processing unit, a second substrate transport mechanism that is provided in the second processing unit, and a control unit that relatively controls the first substrate transport mechanism, the second substrate transport mechanism, or the substrate placing base so that the distance between the first substrate transport mechanism and the heater and the distance between the second substrate transport mechanism and the heater become equal to each other. Accordingly, the heat condition is the same because the distance between each substrate and each heater become the same and the heat influences of the substrate become the same.

According to another aspect of the invention, there is provided a substrate processing method including the steps of supplying at least two substrates to a processing chamber having a first processing unit, a second processing unit, and a substrate placing base on which the substrates are placed, Placing at least the two substrates respectively on a first substrate transport mechanism of the first processing unit and a second substrate transport mechanism of the second processing unit, and relatively controlling the first substrate transport mechanism, the second substrate transport mechanism, or the substrate placing base so that the distance between the first substrate transport mechanism and a heater provided in the substrate placing base and the distance between the second substrate transport mechanism and the heater provided in the substrate placing base become equal to each other, when the substrates are placed on the substrate placing base. Accordingly, the heat condition is the same because the distance between each substrate and each heater become the same and the heat influences of the substrate become the same.

What is claimed is:

1. A substrate processing apparatus comprising:
  a transport chamber;
  a processing chamber that processes substrates;
  a first processing unit provided in the processing chamber and having a first substrate placing base;
  a second processing unit provided in the processing chamber and having a second substrate placing base and a substrate holding pin configured to hold the substrate thereon and move the substrate vertically onto an upper surface of the second substrate placing base;
  a first substrate transport member provided in the transport chamber and configured to transport the substrates from the transport chamber to the processing chamber;
  a second substrate transport member provided in the processing chamber and configured to transport the substrates substantially horizontally from a position above the first processing unit to a position above the second processing unit in the processing chamber, the second substrate transport member comprising an arm having an arcuate portion and a plurality of claw portions that inwardly extend from the arcuate portion; and
  a controller configured to position the second substrate transport member to wait in a position below an upper surface of the second substrate placing base such that the arcuate portion surrounds a circumference of an outer peripheral lower portion of the second substrate placing base in the course of processing the substrate,
  wherein the second substrate transport member is configured to move up and down vertically and to turn about a shaft portion.

2. The substrate processing apparatus according to claim 1, wherein the first substrate transport member and the second substrate transport member are configured to wait above the first processing unit.

3. The substrate processing apparatus according to claim 1, further comprising:
  a first substrate holding portion configured to hold a substrate in a state maintaining a predetermined distance from an upper surface of the first processing unit; and
  a second substrate holding portion configured to hold a substrate in a state maintaining a predetermined distance from an upper surface of the second processing unit,
  wherein the first processing unit includes a first heater configured to heat a substrate of the substrates on the first processing unit,
  wherein the second processing unit includes a second heater configured to heat a substrate of the substrates on the second processing unit, and
  wherein the first substrate holding portion moves so that a distance between the substrate held on the first substrate holding portion and the first heater and a distance between the substrate held on the second substrate holding portion and the second heater are equal.

4. The substrate processing apparatus according to claim 1, wherein a height of the outer peripheral lower portion of the second substrate placing base is a height where a gas flow from an outer periphery of the second substrate placing base is not disturbed by the second substrate transport member.

5. The substrate processing apparatus according to claim 1, wherein an outer diameter of the arcuate portion is larger than that of the substrates, and
  wherein the arm is configured to move up and down vertically and to turn about a shaft portion.

6. The substrate processing apparatus according to claim 1, wherein the first substrate transport member has a finger pair including an upper finger and a lower finger, and
  wherein the upper finger and the lower finger are separated by a predetermined vertical interval.

7. The substrate processing apparatus according to claim 6, wherein the finger pair of the first substrate transport member is configured to stop above the first processing unit, and
  wherein the second substrate transport member is configured to stop between the upper finger and the lower finger of the finger pair above the first processing unit.

8. The substrate processing apparatus according to claim 7,
wherein the first processing unit has a plurality of first substrate holding pins configured to move up and down vertically,
wherein the plurality of the first substrate holding pins are configured to move up so as to hold a substrate placed on the lower finger of the finger pair on top of the plurality of the first substrate holding pins, and
wherein the second substrate transport member is configured to move up so as to hold a substrate placed on the upper finger of the finger pair on the second substrate transport member.

9. The substrate processing apparatus according to claim 1, wherein the first substrate placing base and the second substrate placing base are provided on one surface in the processing chamber.

10. The substrate processing apparatus according to claim 1,
wherein the second substrate transport member is configured to move between a position above the first processing unit and a position above the second processing unit.

* * * * *